(12) United States Patent
Itou et al.

(10) Patent No.: US 6,998,951 B2
(45) Date of Patent: Feb. 14, 2006

(54) COMMON MODE CHOKE COIL ARRAY

(75) Inventors: Kenichi Itou, Sagamihara (JP); Katsuji Matsuta, Yokohama (JP); Masahiko Kawaguchi, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/334,946

(22) Filed: Jan. 2, 2003

(65) Prior Publication Data

US 2003/0137384 A1     Jul. 24, 2003

(30) Foreign Application Priority Data

Jan. 22, 2002  (JP)  .............................. 2002-013052

(51) Int. Cl.
*H01F 5/00* (2006.01)
(52) U.S. Cl. ......................................... 336/200; 336/83
(58) Field of Classification Search ................. 336/83, 336/200, 232
See application file for complete search history.

(56) References Cited

U.S. PATENT DOCUMENTS

| | | | |
|---|---|---|---|
| 5,497,137 A * | 3/1996 | Fujiki | 336/200 |
| 6,529,720 B1 * | 3/2003 | Jovenin et al. | 455/318 |
| 6,573,821 B1 * | 6/2003 | Peels et al. | 336/200 |

FOREIGN PATENT DOCUMENTS

| | | | |
|---|---|---|---|
| JP | 53-124585 | | 10/1978 |
| JP | 55-042311 U | | 3/1980 |
| JP | 01-147152 | | 6/1989 |
| JP | 03-086619 U | | 9/1991 |
| JP | 06-215949 | | 8/1994 |
| JP | 08-138937 | * | 5/1996 |
| JP | 08-186024 | | 7/1996 |
| JP | 10-116729 | | 5/1998 |
| JP | 10-270256 | | 10/1998 |
| JP | 2001-358022 | | 12/2001 |

OTHER PUBLICATIONS

Official Communication dated Sep. 20, 2005, issued in the corresponding Japanese Patent Application No. 2002-013052.

* cited by examiner

*Primary Examiner*—Tuyen T Nguyen
(74) *Attorney, Agent, or Firm*—Keating & Bennett, LLP (57) ABSTRACT

A common mode choke coil array of a two-element type includes two common mode choke coil elements including at least two spiral coils and arranged side by side in a laminate body (chip member) in plan view. The spiral coils are configured so that the number of turns of the coils on the sides thereof where the coils are adjacent to each other is smaller than the number of turns of the coils on the sides thereof where the coils are distant from each other. The spiral directions of the coils arranged side by side are opposite to each other.

20 Claims, 11 Drawing Sheets

FIG. 11
PRIOR ART

COMMON MODE CHOKE COIL ARRAY

BACKGROUND OF THE INVENTION

1. Field of the Invention

The present invention relates to a common mode choke coil array, and more particularly, to a two-element type common mode choke coil array having a structure in which two common mode choke coil elements including spiral coils are arranged side by side in plan view.

2. Description of the Related Art

A common mode choke coil array as described in Japanese Unexamined Patent Application Publication No. 8-138937 is an example of related art common mode choke coil arrays.

Figure 11:
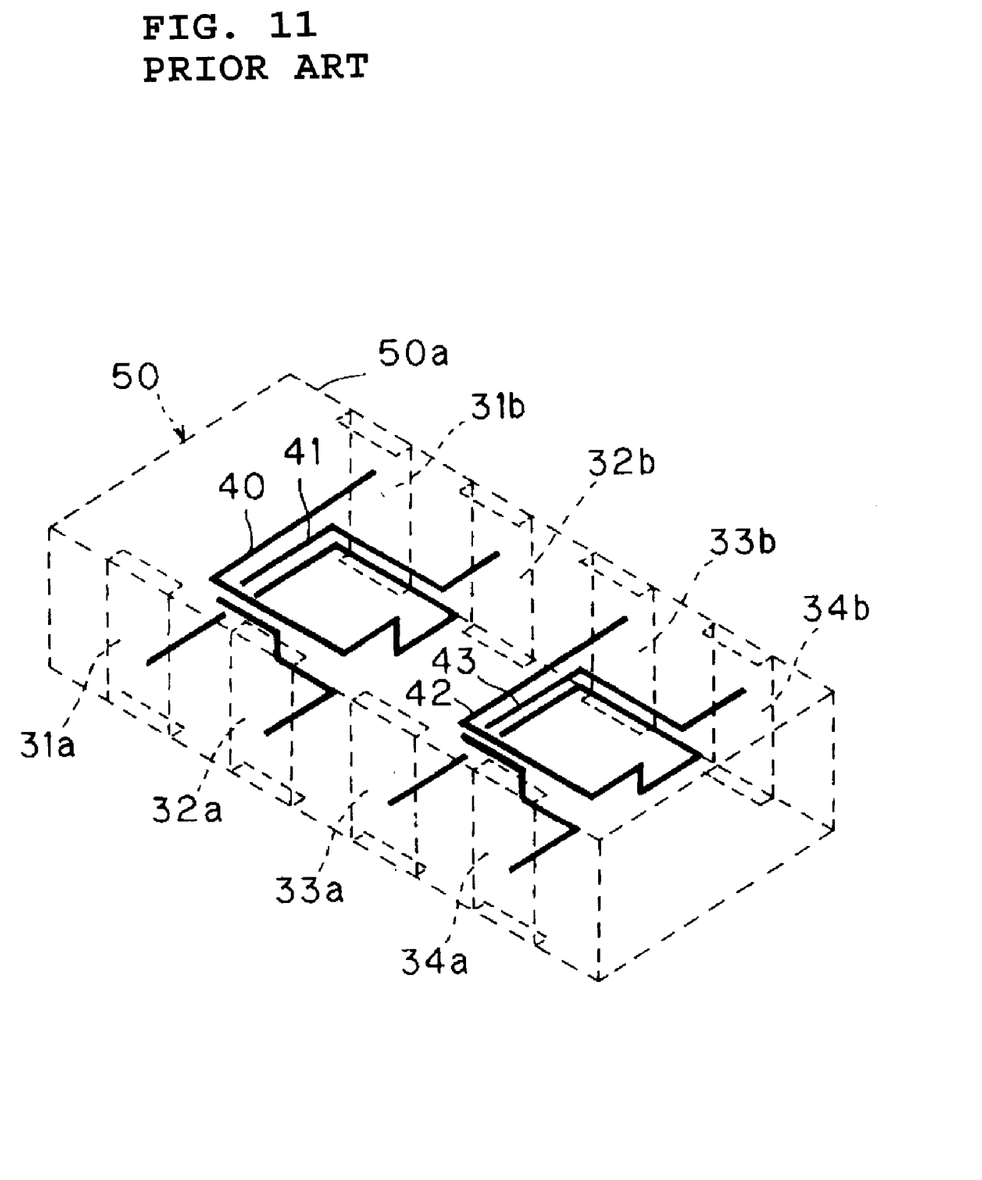
FIG. 11 is a perspective view of a related art lamination type common mode choke coil.

FIG. 11 illustrates the common mode choke coil array. A common mode choke coil (lamination type common mode choke coil) 50 is produced by alternately laminating insulating members and coil conductors, and integrally firing the laminated insulating members and coil conductors. Coils 40 and 41 and coils 42 and 43 are defined by electrically connecting the coil conductors, respectively. The coils 40 and 41 are paired, and the coils 42 and 43 are also paired. Thus, two common mode choke coils are formed. External electrodes 31a, 31b, 32a, 32b, 33a, 33b, 34a, and 34b are disposed at predetermined positions on the laminate body 50a so as to be electrically connected to both-ends of the coils 40, 41, 42, and 43, respectively.

Referring to the case where two coils are arranged side by side and adjacent to each other in plan view as in the lamination type common mode choke coil 50 (that is, the coils 40 and 42 are arranged side by side and adjacent to each other, as well as the coils 41 and 43), if the coils are desired to be arranged closely to each other, problems will be caused in that crosstalk generated between the adjacent coils (the internal conductors constituting the coils) becomes larger.

Accordingly, in the above-described lamination type common mode choke coil 50, one pair of the coils 40 and 41 is arranged to be sufficiently distant from the other pair of the coils 42 and 43 so that the adjacent coils exert no influences upon each other.

Thus, the lamination type common mode choke coil 50 has problems in that the respective coils are required to be arranged with a distance between them, so that the size of the choke coil 50 can not sufficiently reduced. If the respective coils are arranged closely to each other, the crosstalk between the adjacent coils will be increased.

SUMMARY OF THE INVENTION

In order to overcome the problems described above, preferred embodiments of the present invention provide a two-element type common mode choke coil array having two common mode choke coil elements arranged in a chip member so as to be adjacent to each other in a plan view, in which crosstalk is minimized and prevented from increasing even when the two common choke coil elements are arranged closely to each other, and hence, which has a greatly reduced size.

According to a first preferred embodiment of the present invention, a common mode choke coil array of a two-element type includes two common mode choke coil elements including spiral coils and arranged side by side in a chip member in a plan view, the spiral coils being configured so that the number of turns of the coils on the sides thereof where the coils are adjacent to each other is smaller than the number of turns of the coils on the sides thereof where the coils are spaced from each other.

Therefore, the magnetic flux exerting influences on the coils from one coil to the other coil can be reduced, and hence, the crosstalk between the coils arranged side by side is minimized and prevented from increasing, due to the numbers of turns of the coils set as described above.

Preferably, each of the spiral coils includes at least two coaxially spiral portions.

In the case in which each spiral coil includes at least two coaxially spiral portions, crosstalk readily occurs between the coils arranged side by side. However, according to preferred embodiments of the present invention, the magnetic flux exerting influences on the coils from one coil to the other coil is greatly reduced. Thus, the crosstalk between the coils arranged side by side is minimized.

Preferably, the spiral directions of the coils arranged side by side are opposite to each other.

Accordingly, the coils can be easily arranged side by side in a symmetrical pattern, and the difference between the inductances is minimized. Moreover, the number of turns in the adjacent sides of the coils arranged side by side can be easily set to be smaller than that in the distant or spaced apart sides thereof.

Preferably, the starting-edges and the terminating-edges of the coils arranged step by step are led to the opposite sides of the chip member in the boundary-line direction of the coils, respectively.

Also, in this case, the number of turns in the adjacent sides of the coils arranged side by side can be easily set to be smaller than that in the distant or spaced apart sides thereof.

Preferably, the chip member is a laminate body which is preferably formed by laminating an insulating layer and coil patterns, the coils each have a two-layer structure including a first coil pattern and a second coil pattern connected in parallel to each other by a viahole, and the essential portions excluding the lead-out portions of the first and second coil patterns overlap each other via the insulating layer.

Accordingly, the patterns having the two-layer structure can be securely coupled to each other. The conductor resistances can be reduced without reduction of the inductances.

Preferably, the common mode choke coil array further includes magnetic members constituting magnetic paths extended in the coil axial direction and arranged in the inner spiral region of each coil and in the outer spiral regions excluding the boundary portions of the coils arranged side by side.

Thus, each of the closed magnetic paths extended substantially through the approximate center of the coil having the magnetic member disposed therein and the outer spiral side of the coil, and is returned to the inner spiral side of the coil can be securely formed. Thus, the coupling degree between the coils is greatly improved, and the leakage of the magnetic flux into the adjacent coil side is prevented, which minimizes the crosstalk, compared to the related art common mode choke coil array. Moreover, the differential mode impedance can be suppressed to a lower level, and effects thereof on the waveform of a signal to be transmitted can be minimized.

Preferably, the common mode choke coil array also preferably includes magnetic substrates disposed on the upper and lower surfaces of the chip member, respectively.

With the magnetic substrates, generated magnetic fluxes can be trapped in the chip member and the magnetic substrates. This intensifies the common magnetic flux generated in a pair of coils constituting one of the common mode choke coils so that a high inductance can be attained. Moreover, since the coupling degree between the coils becomes high, the leakage of the magnetic flux into the adjacent coil side is prevented, so that the crosstalk can be further minimized. Also, the differential mode impedance can be minimized.

According to a second preferred embodiment of the present invention, a common mode choke coil array of a two-element type includes two common mode choke coil elements including spiral coils and arranged side by side in a chip member on a plan view, magnetic members constituting magnetic paths extended in the coil axial direction and arranged in the inner spiral region of each coil and in the outer spiral regions excluding the boundary portions of the coils arranged side by side, and magnetic substrates disposed on the upper and lower surfaces of the chip member, respectively.

According to the above-described construction which includes the magnetic members and the magnetic substrates, the common magnetic flux generated in at least two coils constituting one common mode choke coil can be intensified, and hence, the coupling degree between the coils is greatly increased. Accordingly, leakage of the magnetic flux into the adjacent coil is decreased, so that the crosstalk is minimized.

Other features, elements, characteristics and advantages of the present invention will become more apparent from the following detailed description of preferred embodiments with reference to the attached drawings.

DETAILED DESCRIPTION OF PREFERRED EMBODIMENTS

Hereinafter, preferred embodiments of the common mode choke coil array of the present invention will be described in detail.

First Preferred Embodiment

Figure 1:
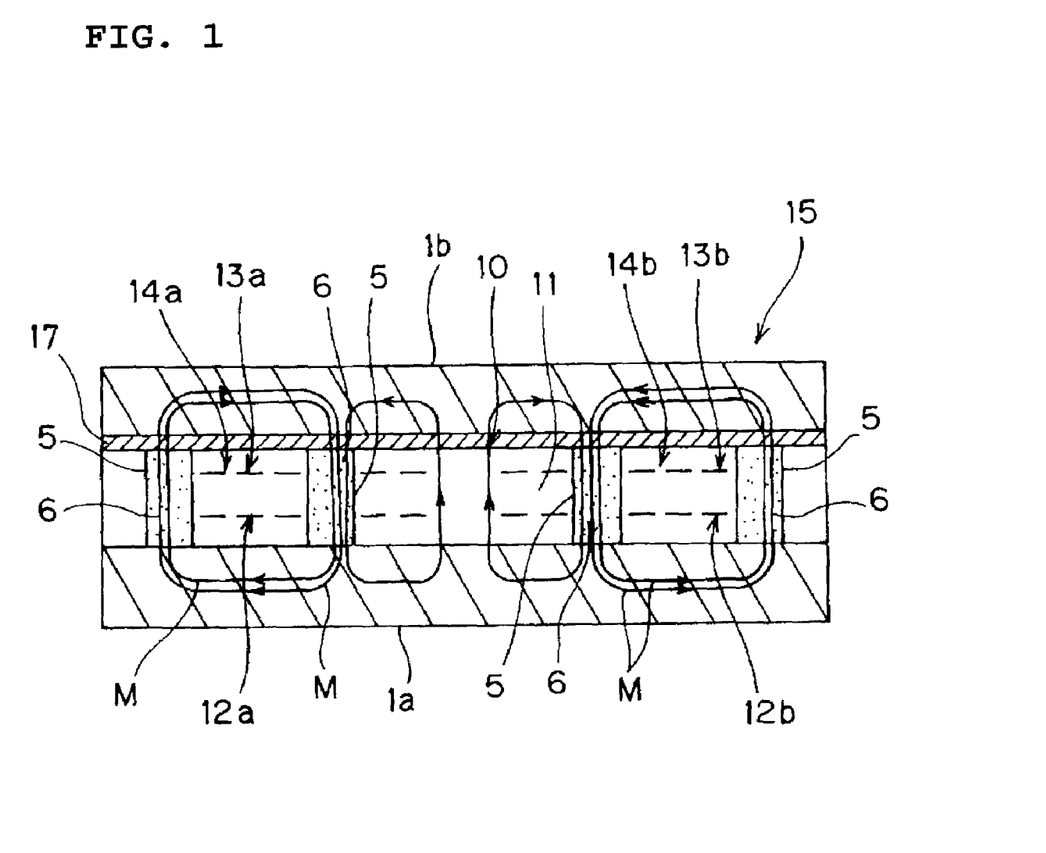
FIG. 1 is a cross-sectional view showing the configuration of the essential portion of a common mode choke coil array according to a first preferred embodiment of the present invention.
Figure 2:
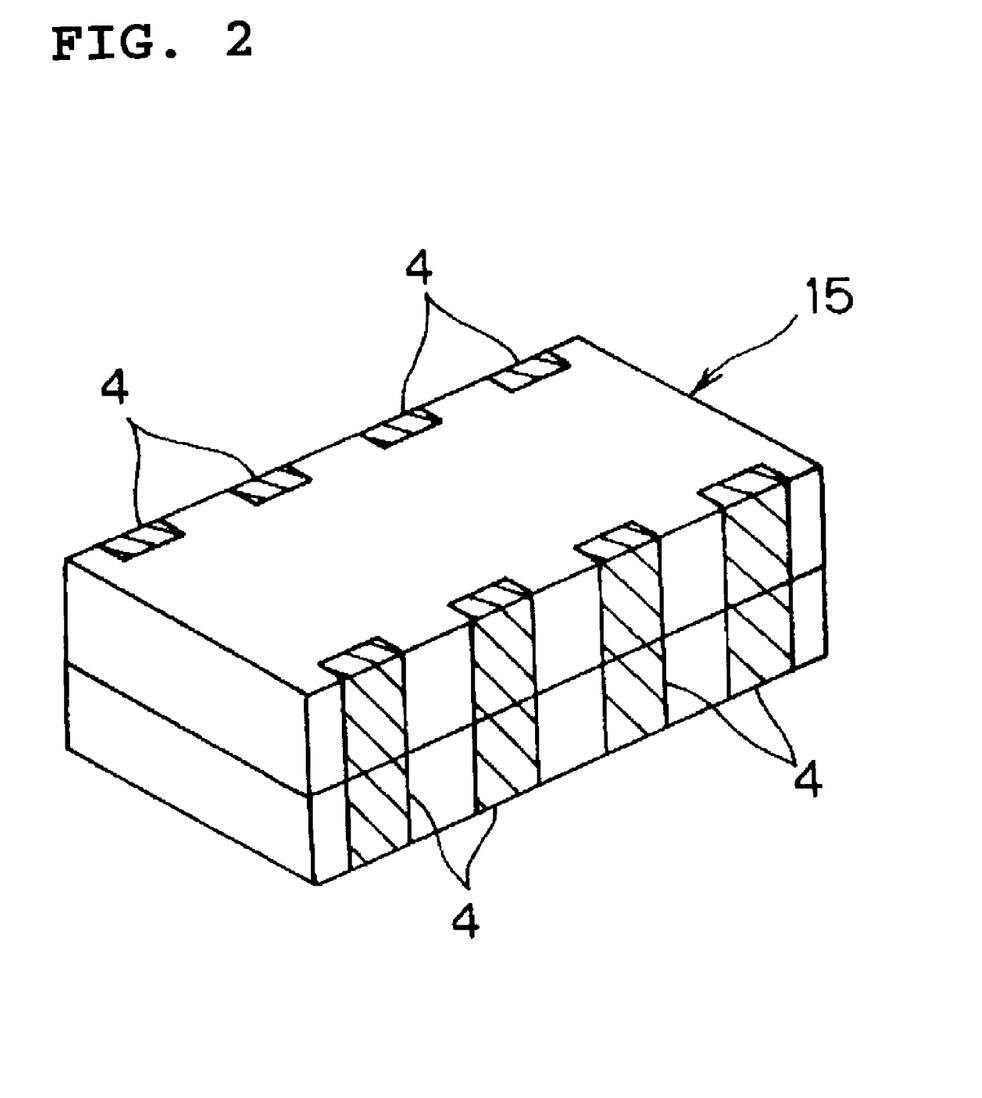
FIG. 2 is a perspective view of the common mode choke coil array according to the first preferred embodiment of the present invention.
Figure 3:
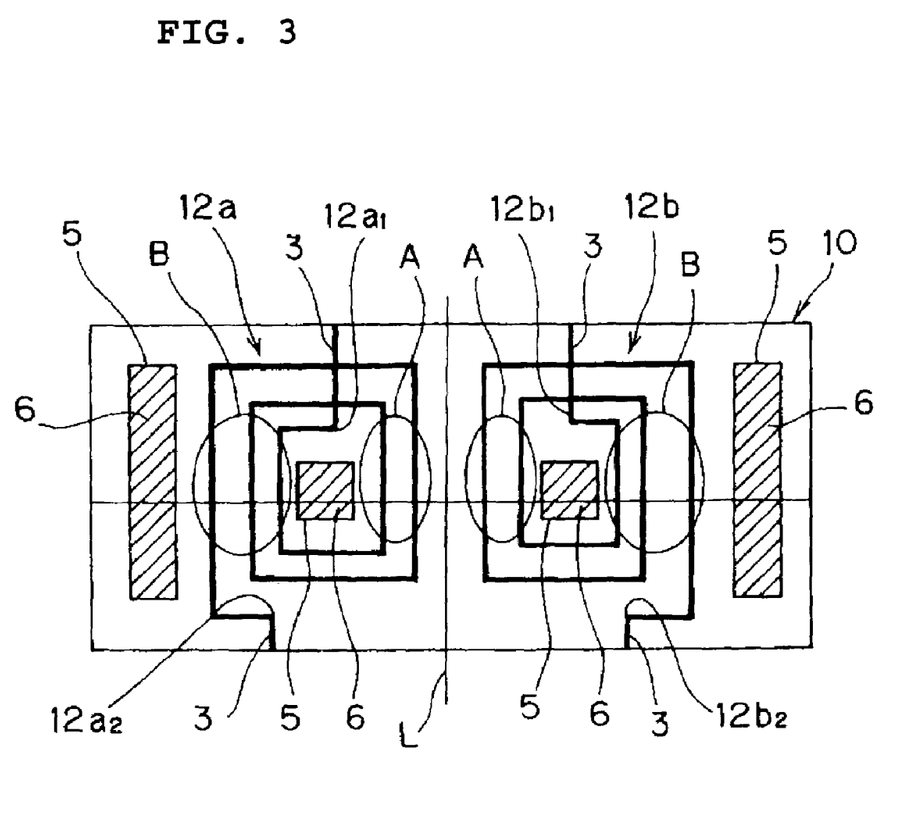
FIG. 3 is a plan view showing a coil pattern for the common mode choke coil array of the first preferred embodiment of the present invention.
Figure 4:
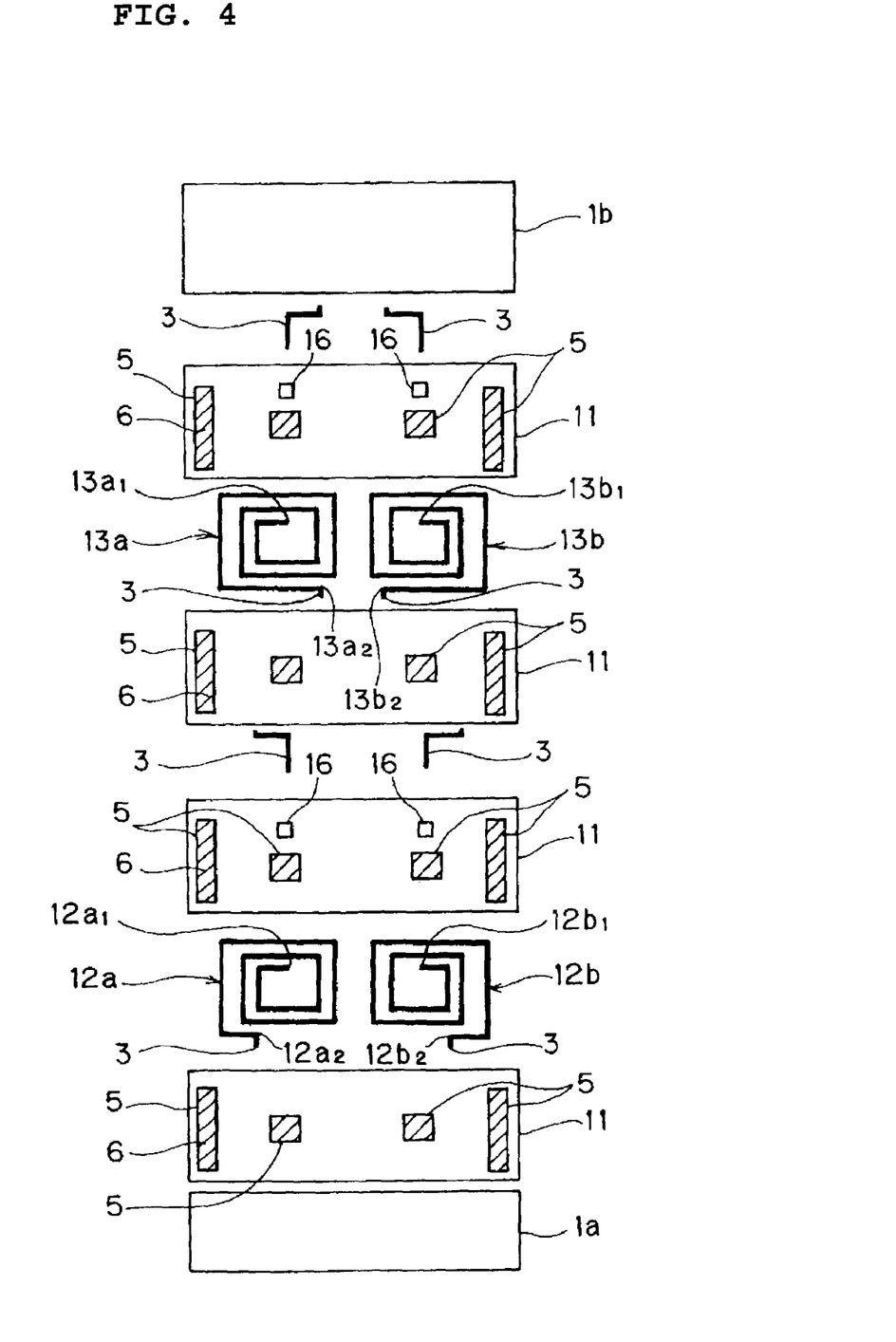
FIG. 4 is an exploded view showing the configuration of the essential portion of the common mode choke coil array of the first preferred embodiment of the present invention.

FIG. 1 is a cross-sectional view of a common mode choke coil array according to a first preferred embodiment of the present invention. FIG. 2 is a perspective view thereof. FIG. 3 is a plan view thereof showing coil patterns. FIG. 4 is an exploded view showing the configuration of the essential portion of the common mode choke coil array of the first preferred embodiment of the present invention.

As seen in FIGS. 1 to 4, the common mode choke coil array preferably includes a laminate body (chip member) 10 and a first magnetic substrate 1a and a second magnetic substrate 1b disposed on the upper and lower surfaces thereof, respectively. The laminate body 10 includes a first common mode choke coil element 14a (see FIG. 1) and a second common mode choke coil element 14b (see FIG. 1) which are arranged side by side and adjacently to each other in a plan view. The first common mode choke coil element 14a includes two spiral coils 12a and 13a which are arranged coaxially in the spiral patterns and separately from each other in the axial direction via an insulating layer 11(see FIG. 4). The second common mode choke coil element 14b includes two spiral coils 12b and 13b which are arranged coaxially in the spiral patterns and separately from each other in the axial direction via the insulating layer 11.

In the laminate body 10, magnetic path holes 5 are formed in the inner spiral regions of the coils 12a, 12b, 13a, and 13b and in the outer spiral regions thereof (on both end sides of the laminate body 10 which are distant from the boundary between the coils arranged side by side). Thus, closed magnetic paths (see FIG. 1) having magnetic members filled therein are formed along the axial direction of the coils 12a, 12b, 13a, and 13b.

The common mode choke coil array further includes a plurality, e.g., eight, lead-out electrodes 3 (see FIG. 4) and a plurality, e.g., eight, terminal electrodes (external electrode) 4 (see FIG. 2) electrically connected to the lead-out electrodes 3, respectively. The lead-out electrodes 3 are arranged so as to be electrically connected to both ends, that is, the starting-ends and terminating-ends (the inner spiral ends and the outer spiral ends) $12a_1$, $12a_2$, $12b_1$, $12b_2$, $13a_1$, $13a_2$, $13b_1$, and $13b_2$ of the coils 12a, 12b, 13a, and 13b, respectively, and be extended to the opposite side surfaces of the bonded structure (part main member) 15 formed as described above.

In the common mode choke coil array, the number of turns of the coils 12a and 12b on the sides thereof where the coils 12a and 12b are adjacent to each other (the sides represented by A in FIG. 3) is smaller than the number of turns of the coils 12a and 12b on the sides thereof where the coils 12a and 12b are distant from each other (the sides represented by B in FIG. 3). This is true of the coils 13a and 13b. In this example, for the coils 12a and 12b and the coils 13a and 13b, the numbers of turns on the adjacent sides A thereof is preferably 2, and the number of turns on the distant sides thereof is preferably 3, respectively.

In this common mode choke coil array, regarding the coils 12a, 12b, 13a, and 13b constituting the common mode choke coil elements 14a and 14b arranged side by side, the spiral directions of the coils 12a and 12b arranged side by side, are opposite to each other, and this is true of the spiral directions of the coils 13a and 13b as seen in FIGS. 1, 3, and 4. In this way, the number of turns on the adjacent sides of the conductors constituting the coils arranged side by side is smaller than that on the distant sides thereof. Moreover, as shown in FIG. 3, the coils 12a and 12b, and also, the coils 13a and 13b are arranged so as to be symmetric about the center line L which bisects the longer sides of the laminate body 10 having a substantially rectangular shape in a plan view (the boundary line between the coils 12a and 12b and also between the coils 13a and 13b). Thereby, the area where one coil is arranged is substantially square. Accordingly, the spiral coils can be efficiently arranged.

The inner spiral edges $12a_1$, $12b_1$, $13a_1$, and $13b_1$ of the coils 12a, 12b, 13a, and 13b are led to one side surface of the laminate body 10, respectively. The both-side edges, that is, the starting-edges and terminating-edges $12a_1$ and $12a_2$, $12b_1$ and $12b_2$, $13a_1$ and $13a_2$, and $13b_1$ and $13b_2$ of the coils 12a, 12b, 13a, and 13b are led out to the side surfaces of the laminate body 10 which are opposite to each other in the boundary line (see FIG. 3) between the coils 12a and 12b and also between the coils 13a and 13b.

In the common mode choke coil array according to the first preferred embodiment, the laminate body 10 having the two coils 12 and 13 disposed therein is sandwiched between the first magnetic substrate 1a and the second magnetic substrate 1b. According to the first preferred embodiment, ferrite substrates with a superior frequency characteristic are used as the fist and second magnetic substrates 1a and 1b. Preferably, the first and second magnetic substrates 1a and 1b polished to have a surface roughness Ra of up to about 0.5 µm are used, whereby problems which may be caused when the insulating layer and the coils (coil pattern) 12a, 12b, 13a, and 13b are formed thereon by a photolithographic technique, can be eliminated.

For example, a magnetic material including about 60% to about 70% by volume of ferrite fine power and about 30% to about 40% by volume of polyimide resin is preferably used for the magnetic members 6 to be filled in the magnetic path holes 5. Since the material including the polyimide resin and the ferrite fine power is preferably used for the magnetic member, the magnetic member 6 has a high thermal resistance and a superior adhesive property for the insulating layer 11 constituting the laminate body 10. Preferably, the ferrite powder to be added is as fine as possible so that the laminate body 10 can be prevented from being damaged. Preferably, the maximum grain size is up to about 3 µm. The resin material used as a component of the magnetic material is not restricted to the polyimide resin. Other different types of resin materials may be used. Furthermore, glass is available for use.

Preferably, metals such as Ag, Pd, Cu, and Al and their alloys which have a superior electro-conductivity are used as materials for constituting the coils 12a, 12b, 13a, and 13b and the lead-out electrodes 3. In the first preferred embodiment, Ag electrodes are preferably used.

Different types of resin materials such as polyimide resin, epoxy resin, and benzocyclobutene resin, glass such as $SiO_2$, dielectrics, magnetic materials having a low permittivity than the magnetic layer, glass ceramics, and other suitable materials may be used for the insulating layer 11. When the photolithographic technique is used, materials having a photosensitivity function are preferably used. For materials for forming the insulating layer 11, a plurality of materials may be combined to be used correspondingly to the purpose of the layer 11. In the first preferred embodiment, the insulation material for forming the insulating layer is preferably a photosensitive polyimide resin.

Preferably, the combination of electrode materials for forming the coil patterns and so forth with insulating materials for forming the insulating layer is selected considering the workability and the adhesive properties of these materials.

Referring to the numbers of turns of the coils 12a, 12b, 13a, and 13b constituting the common mode choke coil elements 14a and 14b in the common mode choke coil array of the first preferred embodiment configured as described above, the number of turns (for example, 2) on the adjacent sides of the coils 12a and 12b is smaller than that (for example, 3) on the distant sides thereof, which is true of the number of turns of the coils 13a and 13b. Therefore, the magnetic flux interlinked with both of the coils 12a and 13a and the coils 12b and 13b, respectively, is minimized, and hence, the crosstalk between the adjacent coils 12a and 12b and between the coils 13a and 13b is minimized.

The magnetic path holes 5 filled with the magnetic members 6 are arranged in the inner spiral regions of the coils 12a, 12b, 13a, and 13b and in the outer spiral regions thereof in the common mode choke coil array, respectively. For example, as shown in FIG. 1, the closed magnetic path M which is extended substantially through the approximate center of the coil 12a (12b) having the magnetic path hole 6 filled with the magnetic member 6 and the outer spiral side thereof, and is returned to the inner spiral side thereof can be securely formed. Accordingly, the common magnetic flux generated in a pair of the coils constituting one common choke coil is intensified, the coupling degree between the coils is greatly improved, and the leakage of the magnetic flux into the adjacent coil side is prevented to reduce the crosstalk, compared to the related art common mode choke coil array. Moreover, the differential mode impedance is suppressed to a lower level, and effects thereof on the waveform of a signal to be transmitted are minimized.

Hereinafter, a method of producing the common mode choke coil array of the first preferred embodiment will be described.

The following description covers production of one common mode choke coil array having two common mode choke coil elements. Usually, a method of simultaneously producing a plurality of common mode choke coil arrays is used, in which a plurality of such elements are formed in a mother substrate, and then, the mother substrate is cut along predetermined positional lines so that the components (common mode choke coil arrays) are formed individually and separately.

(1) First, the insulating layers 11 and the internal electrodes (electrode patterns for constituting the coils 12a, 12b, 13a, and 13b and the lead-out electrodes 3) are laminated onto the first magnetic substrate 1a. Thus, the laminate body 10 is formed in which the first common mode choke coil element 14a (see FIG. 1) and the second common mode choke coil element 14b (see FIG. 1) are arranged side by side. The first common mode choke coil element 14a includes the two spiral coils 12a and 13a which are arranged coaxially in the spiral patterns and separately from each other in the axial direction via the insulating layer 11(see FIG. 4). Similarly, the second common mode choke coil element 14b includes the two spiral coils 12b and 13b which are arranged coaxially in the spiral patterns and separately from each other in the axial direction via the insulating layer 11.

The magnetic path holes 5 for forming the magnetic paths 5 which extend from the first magnetic substrate 1a to the second magnetic substrate 1b to be laminated to the first magnetic substrate 1a in the subsequent process are formed in the insulating layers 11 preferably by a photolithographic technique.

Viaholes 16 (see FIG. 4) for connecting the inner spiral edges $12a_1$, $12b_1$, $13a_1$, and $13b_1$ of the coils 12a, 12b, 13a, and 13b to the lead-out electrodes 3 are formed in the predetermined insulating layers 11. In the first preferred embodiment, the viaholes 6 are formed in the second and fourth insulating layers 11 (in the order from the lower surface in FIG. 4).

Thereby, the laminate body 10 is formed in which the inner spiral edges $12a_1$, $12b_1$, $13a_1$, and $13b_1$ of the coils 12a, 12b, 13a, and 13b are connected to the lead out electrodes 3 via the viaholes 16, respectively, and moreover, the outer spiral edges $12a_2$, $12b_2$, $13a_2$, and $13b_2$ are connected to the lead-out electrodes 3 in the same planes, respectively, whereby the outer spiral edges $12a_2$, $12b_2$, $13a_2$, and $13b_2$ are extended to opposite side surfaces of the laminate body 10.

(2) Next, the magnetic material 6 (a material including a polyimide resin and ferrite fine powder and having a permittivity of about 2 to about 7) is applied to the upper surface of the laminate body 10 by a printing process, so that the magnetic path holes 6 formed in the laminate body 10 are filled with the magnetic material 6.

(3) Thereafter, the second magnetic substrate 1b is bonded to the upper surface of the laminate body 10. Thus, the bonding structure member (part main member) 15 having a structure in which the laminate body 10 is sandwiched between the first and second magnetic substrates 1a and 1b is formed. Moreover, a non-magnetic adhesive layer 17 is disposed between the laminate body 10 and the second magnetic substrate 1b. Different types of adhesives may be used for the adhesive layer 17. For example, a thermoplastic polyimide resin may be used.

In the case where a so-called multi-piece production method is used in which multiple elements are produced by dividing a mother substrate, the formed bonding structure member is cut along the predetermined positional lines by dicing or other suitable process to be divided into respective members (the part main member 15).

(4) Subsequently, the terminal electrodes 4 (external electrodes, see FIG. 4) are formed on the side surfaces of the main member 15 so as to be electrically connected to the lead-out electrodes 3 which have been led out from the coils 12 and 13. Thus, the common mode choke coil array shown in FIGS. 1 and 2 is formed.

Effects of the arrangement of the coils on the crosstalk were determined as follows. The adjacent coils as described above were formed in different arrangements, and the crosstalk values were determined.

Figure 5:
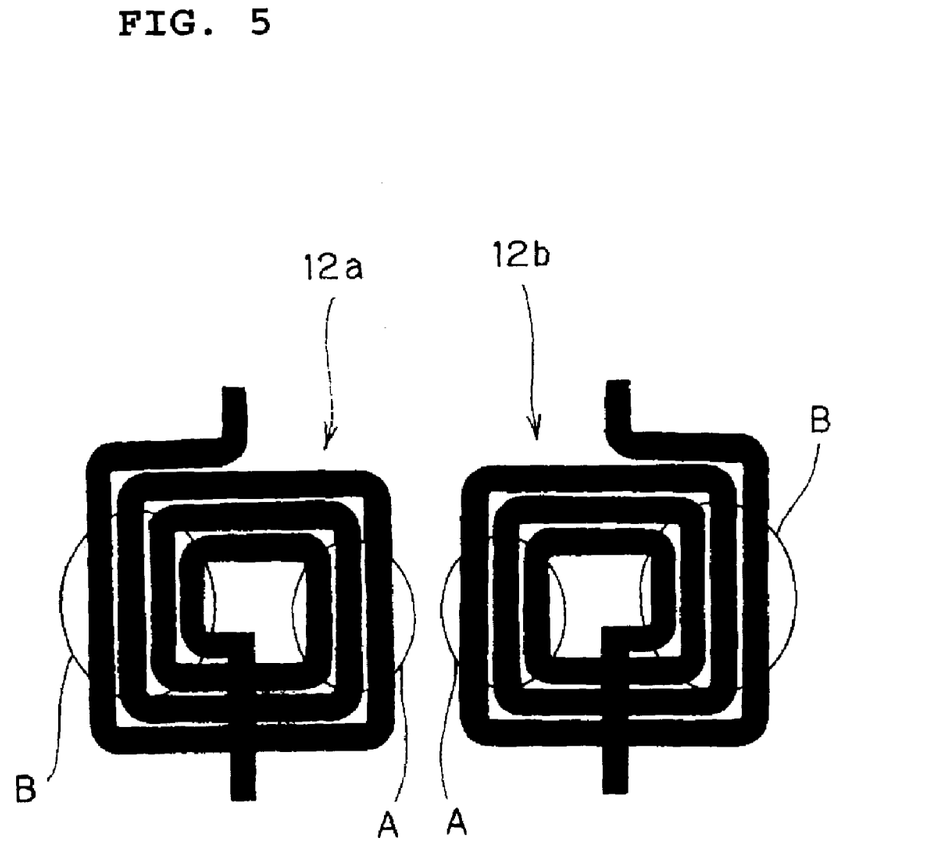
FIG. 5 is a plan view showing the coil patterns of the common mode choke coil array according to preferred embodiments of the present invention which are used for determination of the crosstalk value.

(a) As shown in FIG. 5, the adjacent coils 12a and 12b were formed as spiral patterns of which the spiral directions were opposite to each other, the number of turns on the adjacent sides of the coils 12a and 12b was 3, and the number of turns on the distant sides thereof was 4. In this case, (one of the preferred embodiments of the present invention), the crosstalk value was about −60 dB (at 100 MHz).

Figure 6A:
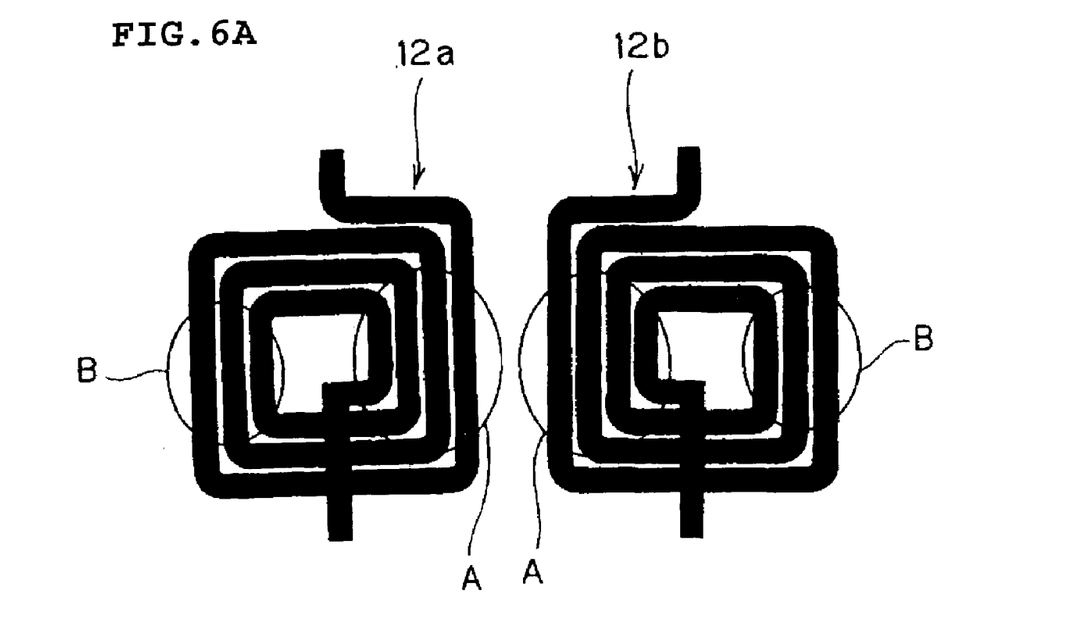
FIGS. 6A and 6B are plan views showing the coil patterns of a common mode choke coil array as a comparative example which are used for determination of the crosstalk values.

(b) As shown in FIG. 6A, the adjacent coils 12a and 12b were formed as spiral patterns of which the spiral directions were opposite to each other, the number of turns on the adjacent sides of the coils 12a and 12b was 4, and that on the distant sides thereof was 3. In this case (a comparative example in which the features of preferred embodiments of the present invention were not included), the crosstalk value was about −51 dB (at 100 MHz). Thus, the characteristic was confirmed to be inferior to that of preferred embodiments of the present invention.

Figure 6B:
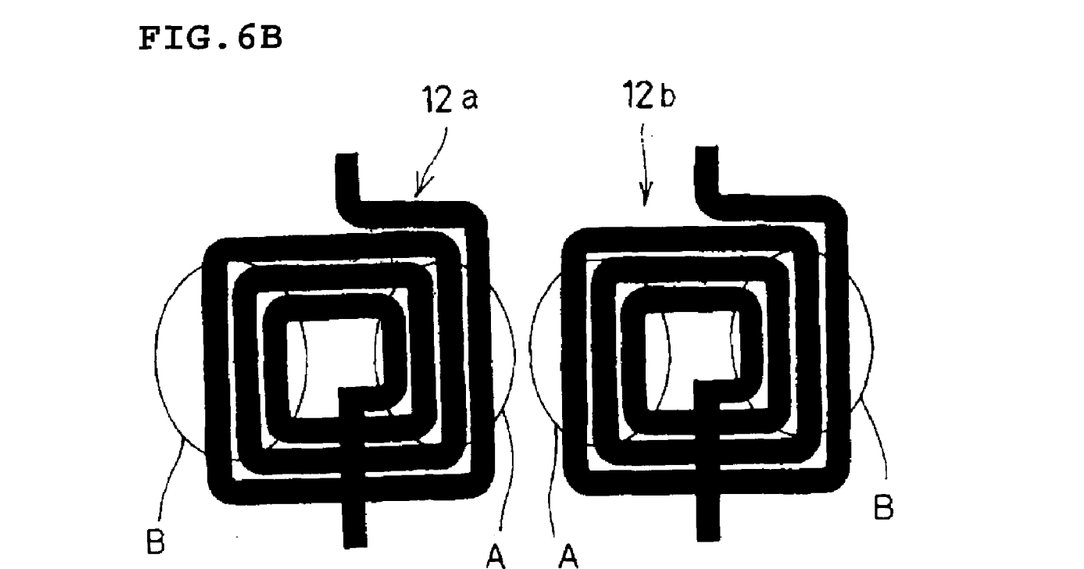

(c) Moreover, as shown in FIG. 6B, when the adjacent coils 12a and 12b were formed as spiral patterns of which the spiral directions were the same, the number of turns in the adjacent side of one coil 12a was 4, that in the distant side thereof was 3, that in the adjacent side of the other coil 12b was 3, and that in the distant side thereof was 4. In this case (the related art case), the crosstalk value was about −55 dB(at 100 MHz). Thus, the characteristic was confirmed to be inferior to that of preferred embodiments of the present invention.

As seen in these results, according to preferred embodiments of the present invention, the crosstalk between the conductors constituting two adjacent coils is minimized. Further, even when at least two elements (coils) are arranged closely to each other, the crosstalk between the coils can be minimized.

According to the first preferred embodiment of the present invention, the first and second magnetic substrates 1a and 1b are arranged on the upper and lower surfaces of the laminate body 10, respectively. However, the array may have a configuration that does not include the second magnetic substrate 1b.

Second Preferred Embodiment

Figure 7:
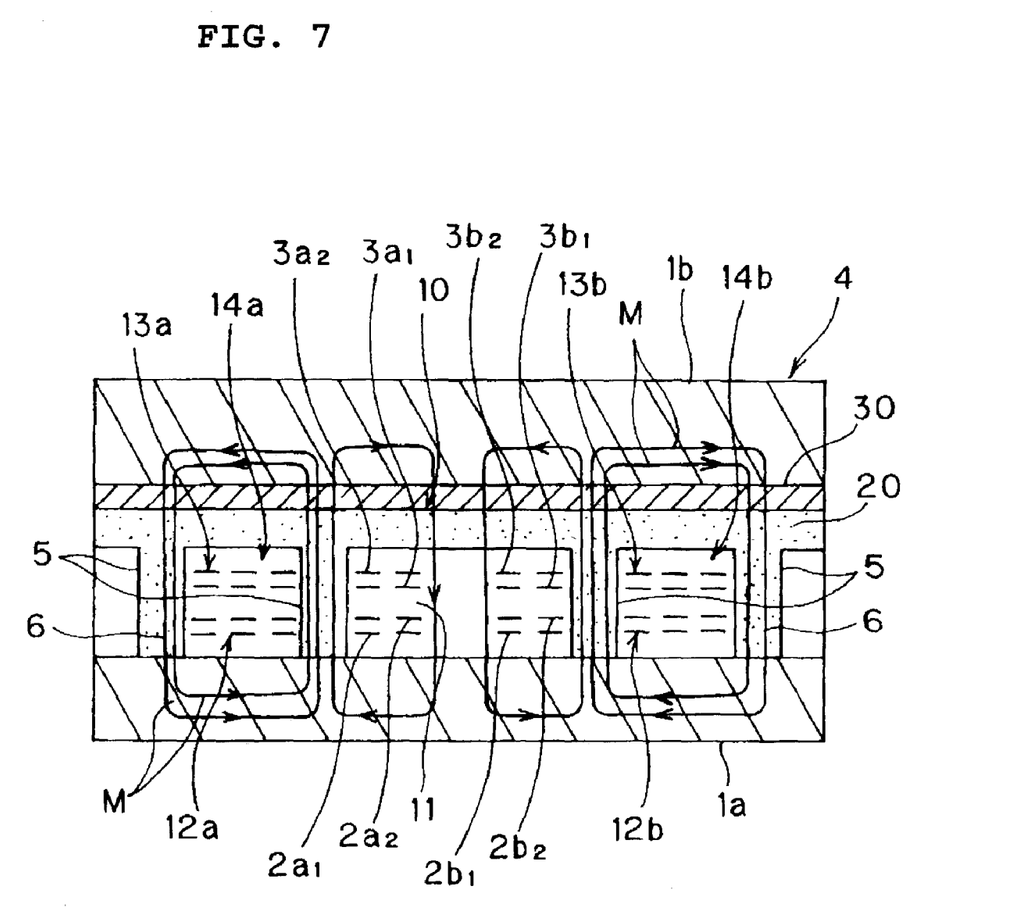
FIG. 7 is a cross-sectional view showing the configuration of the essential portion of a common mode choke coil array according to a second preferred embodiment of the present invention.

FIG. 7 is a cross-sectional view of the configuration of the essential portion of a common mode choke coil array according to another preferred embodiment (second preferred embodiment) of the present invention. FIG. 2 is an exploded view of the configuration of the essential portion thereof.

Figure 8:
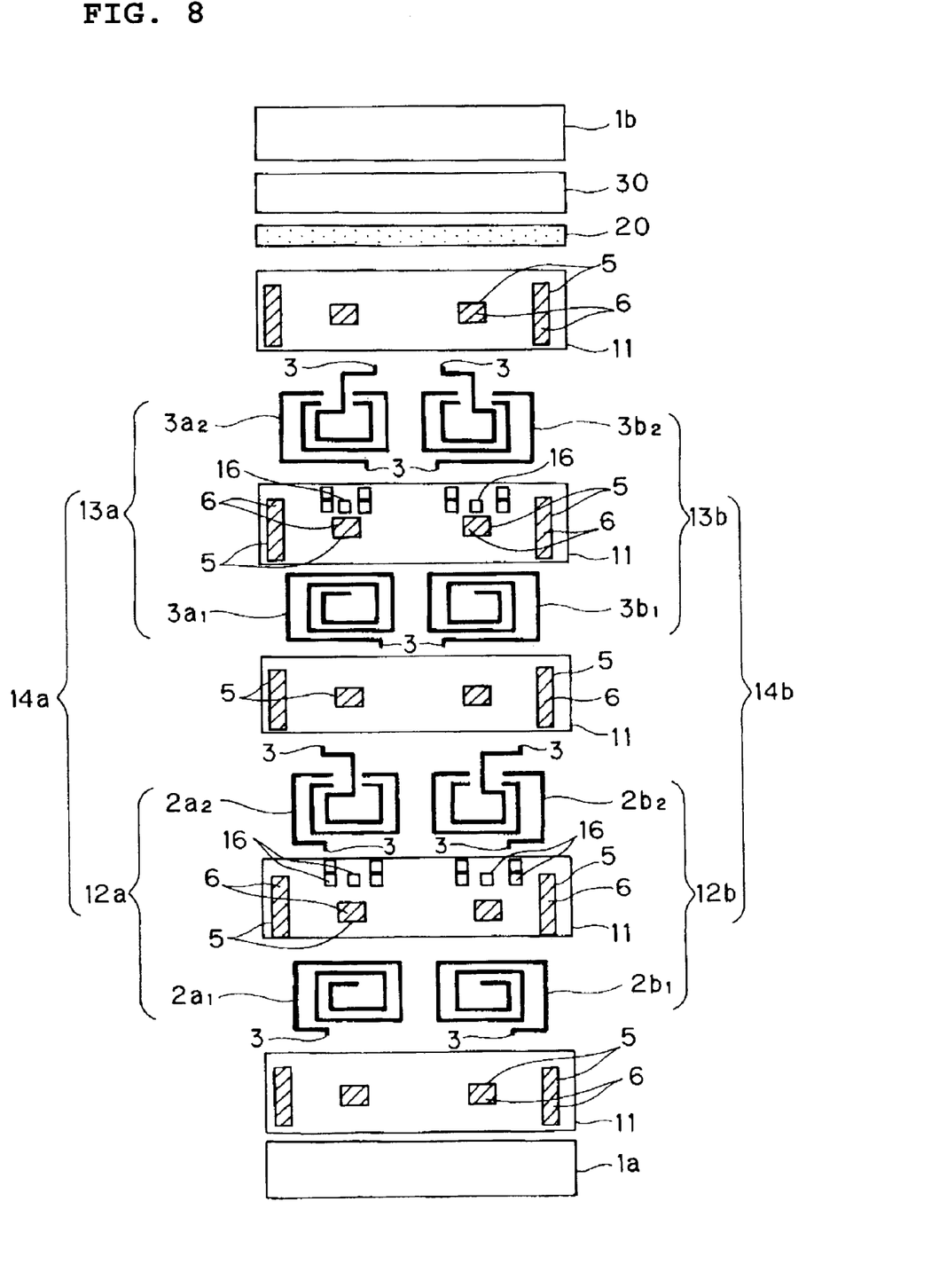
FIG. 8 is an exploded view showing the configuration of the essential portion of the common mode choke coil array of the second preferred embodiment of the present invention.

In FIGS. 7 and 8 showing the common mode choke coil array of the second preferred embodiment, the elements designated by the same reference numerals as those in FIGS. 1 to 4 are the same as or are equivalent to the elements in FIGS. 1 to 4.

As seen in FIGS. 7 to 8, the common mode choke coil array includes the laminate body 10, the first magnetic substrate 1a on which the laminate body 10 is disposed, a magnetic layer 20 disposed on the upper surfaces of the laminate body 10, and the second magnetic substrate 1b disposed on the magnetic layer 20 via a non-magnetic adhesive layer 30. The laminate body 10 includes the first common mode choke coil element 14a (see FIG. 1) and the second common mode choke coil element 14b which are arranged adjacently to each other. The first common mode choke coil element 14a includes the two spiral coils 12a and 13a which are arranged coaxially in the spiral patterns and separately from each other in the axial direction. The second common mode choke coil element 14b includes the two spiral coils 12b and 13b which are arranged coaxially in the spiral patterns and separately from each other in the axial direction via the insulating layer 11.

The magnetic path holes 5 are formed in the inner spiral regions and also in the outer spiral regions with respect to the coils 12a, 12b, 13a, and 13b of the laminate body 10 (the outer spiral regions lie in the opposite regions distant from the boundary between adjacent coils of the laminate body 10). The magnetic path holes 5 are extended in the axial directions of the coils 12a, 12b, 13a, and 13b, and are filled with the magnetic members 6, so that the closed magnetic paths M (see FIG. 7) are formed. The magnetic members 6 filled in the magnetic path holes 5 are integrated with the magnetic layer 20 disposed on the upper surface of the laminate body 10.

In the common mode choke coil array according of the second preferred embodiment, a thermoplastic polyimide resin is preferably used for the non-magnetic adhesive layer 30. A magnetic material including about 60% to about 70% by volume of ferrite fine powder and about 30% to about 40% by volume of polyimide resin is preferably used for the magnetic members 6.

Moreover, in the common mode choke coil array of the second preferred embodiment, each of the coils 12a, 12b, 13a, and 13b preferably includes a first coil pattern and a second coil pattern, which are formed via an insulation layer 11 and electrically connected in parallel to each other via a viahole 16.

In particular, (1) the coil 12a includes a first coil pattern $2a_1$ and a second coil pattern $2a_2$, (2) the coil 12b includes a first coil pattern $2b_1$ and a second coil pattern $2b_2$, (3) the coil 13a includes a first coil pattern $3a_1$ and a second coil pattern $3a_2$, and (4) the coil 13b includes a first coil pattern $3b_1$ and a second coil pattern $3b_2$.

The essential portions excluding the lead-out portions of the first coil pattern and the second coil pattern constituting each of the coils 12a, 12b, 13a, and 13a preferably have substantially the same the shape and size, and have a two-layer structure in which the first and second coil patterns overlap each other via the insulating layer 11.

As described above, the first coil patter $2a_1$ and the second coil pattern $2a_2$ are connected in parallel to each other via the viahole 16, and thereby, the DC resistance (Rdc) can be reduced.

Moreover, the second coil pattern $2a_2$ and the lead-out electrode 3 are preferably formed on the same insulating layer 11. Thereby, the difference in height caused by the lead-out electrode 3 is eliminated.

The first coil pattern $2b_1$ and the second coil pattern $2b_2$, the first coil pattern $3a_1$ and the second coil pattern $3a_2$, and the first coil pattern $3b_1$ and the second coil pattern $3b_2$ are preferably configured in the same way as described above, respectively.

In the common mode choke coil array of the second preferred embodiment, as described above, each of the coils 12a, 12b, 13a, and 13b has a two-layer structure which includes the first coil pattern and the second coil pattern. The essential portions of the two layer coil patterns are preferably formed so as to have substantially the same size and shape, and overlap each other. Therefore, the two-layer structure coil patterns can be securely coupled to each other. The conductor resistance can be decreased without reduction of the inductance.

Moreover, the magnetic members 6 are filled in the magnetic path holes 5, and the magnetic layer 20 is formed on the upper surface of the laminate body 10. Therefore, as shown in FIG. 7, the closed magnetic path M which is extended substantially through the approximate center of the coil 12b having the magnetic path hole 5 filled with the magnetic member 6, the magnetic layer 20, and the outer spiral side with respect to the coil 12b of the laminate body 10 to the first magnetic substrate 1a, and then, is returned to the inner spiral side with respect to the coil 12b of the laminate body 10 can be securely formed. The common magnetic fluxes generated in the coils 12a and 13a and in the coils 12b and 13b are intensified. Thus, the coupling degree between the coils is greatly improved, and the leakage of the fluxes into the adjacent coil sides is reduced so that the crosstalk can be minimized. Also, the differential mode impedance can be suppressed to a very low level, and effects on the waveform of a signal to be transmitted can be minimized.

With the non-magnetic adhesive layer 3 provided between the magnetic layer 20 and the second magnetic substrate 1b, a very high adhesive property can be secured. Moreover, since the nonmagnetic gap is formed between the magnetic layer 20 and the second magnetic substrate 1b, though the gap thickness is very small, the inductance characteristic of which the variation is small until the high frequency region can be attained compared to the case where the second magnetic substrate 1b is formed in contact with the magnetic layer 20.

The common mode choke coil array of the second preferred embodiment preferably has essentially the same configuration as that of the first preferred embodiment, and can be produced in a way similar to that for the first preferred embodiment.

Third Preferred Embodiment

Figure 9:
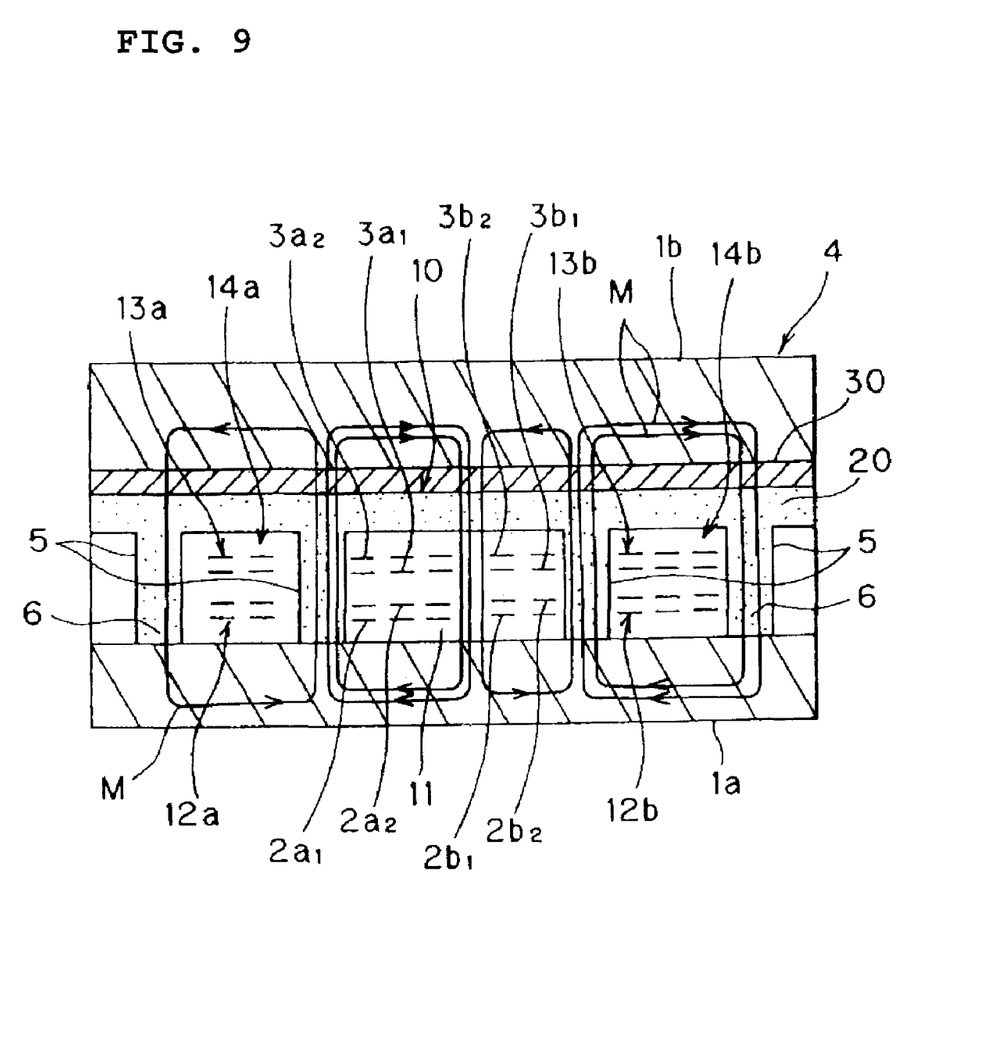
FIG. 9 is a cross-sectional view showing the configuration of the essential portion of a common mode choke coil array according to a third preferred embodiment of the present invention.
Figure 10:
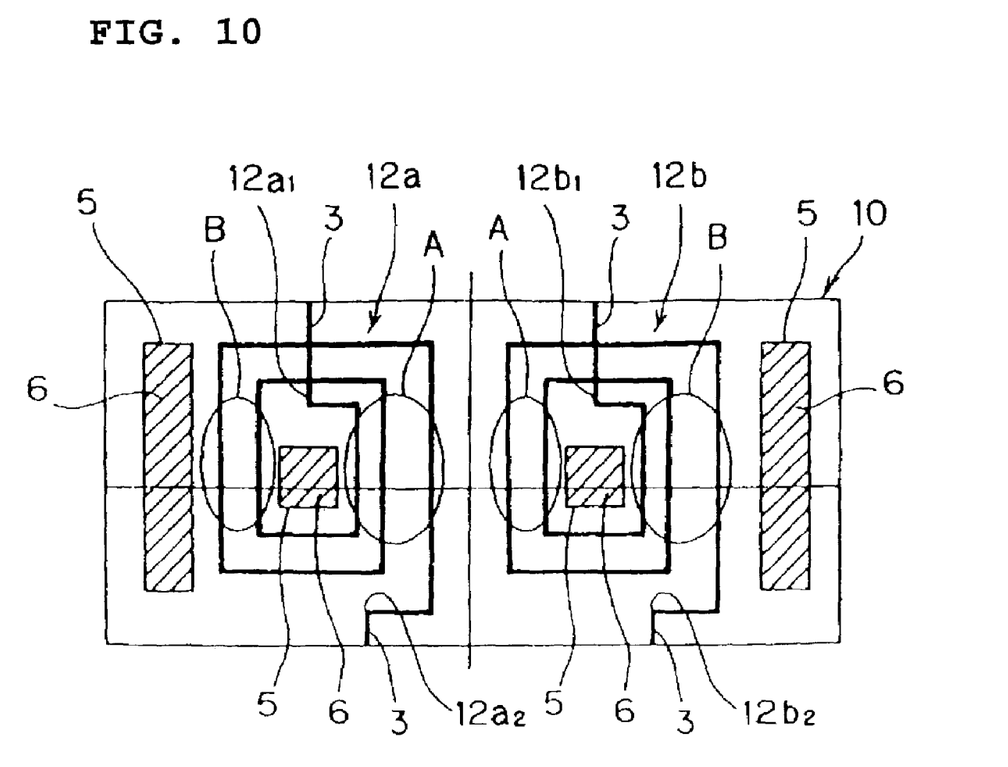
FIG. 10 is a plan view showing the configuration of the essential portion of the common mode choke coil array according to the third preferred embodiment of the present invention.

FIG. 9 is a cross-sectional view of the configuration of the essential portion of a common mode choke coil array according to still another preferred embodiment (third preferred embodiment) of the present invention. FIG. 10 is a plan view of the configuration of the essential portion thereof. In FIGS. 9 and 10, the elements designated by the same reference numerals as those in FIGS. 7 and 8 are the same as or are equivalent to the elements in FIGS. 7 and 8.

In the common mode choke coil array of the third preferred embodiment, the spiral directions of the adjacent coils 12a and 12b are the same, and also, the spiral directions of the coils 13a and 13b are the same. The number of turns in the adjacent sides of the left-side coils 12a and 13a is preferably three, respectively. The number of turns in the adjacent sides of the right-side coils 12b and 13b is preferably two.

The other configuration of the common mode choke coil array of the third preferred embodiment is preferably the same as that of the second preferred embodiment. The common mode choke coil array of the third preferred embodiment includes the laminate body 10, the first magnetic substrate 1a on which the laminate body 10 is disposed, the magnetic layer 20 disposed on the upper surfaces of the laminate body 10, and the second magnetic substrate 1b disposed on the magnetic layer 20 via a non-magnetic adhesive layer 30. The laminate body 10 includes the first common mode choke coil element 14a and the second common mode choke coil element 14b (see FIG. 9) which are arranged adjacently to each other inside of the laminate body 10. The first common mode choke coil element 14a includes the two spiral coils 12a and 13a which are arranged coaxially in the spiral patterns and separately from each other in the axial direction. The second common mode choke coil element 14b includes the two spiral coils 12b and 13b which are arranged coaxially in the spiral patterns and separately from each other in the axial direction via the insulating layer 11.

The magnetic path holes 5 are formed in the inner spiral regions and also in the outer spiral regions with respect to the coils 12a, 12b, 13a, and 13b of the laminate body 10 (the outer spiral regions lie in the opposite regions distant from the boundary between adjacent coils of the laminate body 10). The magnetic path holes 5 are extended in the axial directions of the coils 12a, 12b, 13a, and 13b, and are filled with the magnetic members 6, so that the closed magnetic paths M (see FIG. 9) are formed.

In the common mode choke coil array of the third preferred embodiment, the spiral directions of the adjacent coils 12a and 12b are preferably the same, and also, the spiral directions of the coils 13a and 13b are preferably the same. The number of turns of the left-side coils 12a and 13a is preferably three, respectively. The number of turns of the right-side coils 12b and 13b is preferably two, respectively. Accordingly, in contrast to the above-described first and second preferred embodiments, the number of turns on the adjacent sides is not smaller than that on the distant sides. However, the magnetic path holes 5 filled with the magnetic members 6 are arranged so as to be elongated in the inner spiral regions of the coils 12a, 12b, 13a, and 13b and in the outer spiral regions (both the end regions distant from the boundary between the adjacent coils of the laminate body 10) of the coils 12a, 12b, 13a, and 13b, respectively. Moreover, the first magnetic substrate 1a is provided on the lower surface of the laminate body 10, and the magnetic layer 20 is provided on the upper surface of the laminate body 10. Furthermore, the second magnetic substrate 1b is provided on the magnetic layer 20 via the non-magnetic adhesive layer 30. Accordingly, the closed magnetic paths M as shown in FIG. 9 are reliably formed. Thus, the common magnetic fluxes generated in the at least two coils constituting the common mode choke coils 14a and 14b can be intensified. The coupling degree between the coils is greatly increased, so that leakage of the magnetic flux into the adjacent coil side can be decreased, which reduces the crosstalk.

According to preferred embodiments of the present invention, the shapes of the coils are not restricted to the spirals described in the preferred embodiments herein.

Different types of configurations having a "turning-around" shape as a whole are available. For example, helical shapes having the same or different coil diameters may be used. Moreover, configurations containing both spiral and helix shapes may be used. Other configurations and shapes may also be used.

The method of forming the coils is not restricted to the printing described in the preferred embodiments above. A thin film forming method using sputtering, photolithography using photosensitive conductive paste, and so forth may be used. In addition, the coils may be formed by use of windings.

Moreover, according to the above-described preferred embodiments, the chip member is formed by lamination of the insulating layers. This is not restrictive. The chip member may be formed by molding an insulating material. In this case, preferably, windings are used as the coils.

Also, in other respects, the present invention is not restricted to the above-described preferred embodiments. Different applications or modifications are possible without departing from the scope of the present invention with respect to the materials and specific shapes of the first and second magnetic substrates, the materials of the insulating layer and the thickness, the materials of the coil patterns, the lamination numbers of the coil patterns and the insulating layers used when the chip member is a laminate body, the size and shape of the chip member, the lead-out positions of the coils, the materials of the magnetic layers, the size and shape of the chip member, the specific shapes of the magnetic holes for forming the magnetic paths in the chip member, arrangement positions, and other characteristics thereof.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A common mode choke coil array comprising:
    a chip member; and
    two common mode choke coil elements including spiral coils and arranged side by side in the chip member; wherein
    the spiral coils are arranged so that a number of turns of the spiral coils on sides thereof where the spiral coils are adjacent to each other is smaller than a number of turns of the spiral coils on sides thereof where the spiral coils are distant from each other along the entire adjacent portion of the spiral coils; and
    the two common mode choke coil elements are separate and distinct elements which are not directly electrically connected to each other.

2. A common mode choke coil array according to claim 1, wherein each of the spiral coils includes at least two coaxial spiral portions.

3. A common mode choke coil array according to claim 1, wherein the spiral directions of the spiral coils arranged side by side are opposite to each other.

4. A common mode choke coil array according to claim 1, wherein starting-edges and terminating-edges of the spiral coils arranged step by step are led to opposite sides of the chip member in a boundary-line direction of the spiral coils.

5. A common mode choke coil array according to claim 1, wherein the chip member is a laminate body including an insulating layer and a plurality of coil patterns, each of the spiral coils having a two-layer structure including a first coil pattern and a second coil pattern connected in parallel to each other by a viahole, and essential portions excluding lead-out portions of the first and second coil patterns overlap each other via the insulating layer.

6. A common mode choke coil array according to claim 1, further comprising magnetic members constituting magnetic paths extending in the coil axial direction and arranged in an inner spiral region of each of the spiral coils and in outer spiral regions excluding boundary portions of the spiral coils arranged side by side.

7. A common mode choke coil array according to claim 1, further comprising magnetic substrates disposed on the upper and lower surfaces of the chip member, respectively.

8. A common mode choke coil array according to claim 1, wherein the number of turns of the spiral coils on sides thereof where the spiral coils are adjacent to each other is two.

9. A common mode choke coil array according to claim 8, wherein the number of turns of the spiral coils on sides thereof where the spiral coils are distant from each other is three.

10. A common mode choke coil array comprising:
    a chip member;
    two common mode choke coil elements including spiral coils and arranged side by side in the chip member;
    magnetic members constituting magnetic paths extending in a coil axial direction and arranged in an inner spiral region of each of the spiral coils and in outer spiral regions excluding an entire portion between the spiral coils; and magnetic substrates disposed on the upper and lower surfaces of the chip member, respectively.

11. A common mode choke coil array according to claim 10, wherein the spiral coils are arranged so that a number of turns of the spiral coils on sides thereof where the spiral coils are adjacent to each other is smaller than a number of turns of the spiral coils on sides thereof where the spiral coils are distant from each other.

12. A common mode choke coil array according to claim 10, wherein each of the spiral coils includes at least two coaxial spiral portions.

13. A common mode choke coil array according to claim 10, wherein the spiral directions of the spiral coils arranged side by side are opposite to each other.

14. A common mode choke coil array according to claim 10, wherein starting-edges and terminating-edges of the spiral coils arranged step by step are led to opposite sides of the chip member in a boundary-line direction of the spiral coils.

15. A common mode choke coil array according to claim 10, wherein the chip member is a laminate body including an insulating layer and a plurality of coil patterns, each of the spiral coils having a two-layer structure including a first coil pattern and a second coil pattern connected in parallel to each other by a viahole, and essential portions excluding lead-out portions of the first and second coil patterns overlap each other via the insulating layer.

16. A common mode choke coil array according to claim 11, wherein the number of turns of the spiral coils on sides thereof where the spiral coils are adjacent to each other is two.

17. A common mode choke coil array according to claim 16, wherein the number of turns of the spiral coils on sides thereof where the spiral coils are distant from each other is three.

18. A common mode choke coil array comprising:
a chip member; and
two common mode choke coil elements including coils arranged side by side in the chip member; wherein
the coils are arranged so that a number of turns of the coils on sides thereof where the coils are adjacent to each other is smaller than a number of turns of the coils on sides thereof where the coils are distant from each other along the entire adjacent portion of the spiral coils; and
the two common mode choke coil elements are separate and distinct elements which are not directly connected together.

19. A common mode choke coil array according to claim 18, wherein the coils are spiral coils.

20. A common mode choke coil array according to claim 18, wherein the coils have a configuration that is one of spiral, a "turning-around" shape, helical, and helix.

* * * * *